United States Patent
Yoshihara et al.

(10) Patent No.: US 7,820,243 B2
(45) Date of Patent: Oct. 26, 2010

(54) RESIST COATING METHOD AND RESIST COATING APPARATUS

(75) Inventors: Kousuke Yoshihara, Koshi (JP); Tomohiro Iseki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 993 days.

(21) Appl. No.: 11/549,793

(22) Filed: Oct. 16, 2006

(65) Prior Publication Data
US 2007/0092642 A1    Apr. 26, 2007

(30) Foreign Application Priority Data
Oct. 21, 2005   (JP) .............................. 2005-306721

(51) Int. Cl.
*B05D 3/12* (2006.01)
(52) U.S. Cl. .................... 427/240; 427/425; 118/52; 118/320; 438/758
(58) Field of Classification Search ............ 427/240, 427/425; 118/52, 320; 438/758
See application file for complete search history.

(56) References Cited

U.S. PATENT DOCUMENTS

| | | | | |
|---|---|---|---|---|
| 5,985,363 | A * | 11/1999 | Shiau et al. | 427/240 |
| 5,989,632 | A * | 11/1999 | Sanada et al. | 427/240 |
| 6,117,486 | A * | 9/2000 | Yoshihara | 427/240 |
| 2004/0076749 | A1 * | 4/2004 | Lee et al. | 427/240 |

FOREIGN PATENT DOCUMENTS

| | | |
|---|---|---|
| JP | 10-151406 | 6/1998 |
| JP | 11-16810 | 1/1999 |
| JP | 11-260717 | 9/1999 |
| JP | 3330324 | 7/2002 |

* cited by examiner

*Primary Examiner*—Kirsten C Jolley
(74) *Attorney, Agent, or Firm*—Oblon, Spivak, McClelland, Maier & Neustadt, L.L.P.

(57) ABSTRACT

A resist coating method supplies a resist solution to substantially the center of a target substrate to be processed while rotating the target substrate at a first rotational speed, then decelerates the rotation of the substrate to a second rotational speed lower than the first rotational speed, or until rotational halt, makes the deceleration smaller in the deceleration step as the rotational speed becomes closer to the second rotational speed or the rotational halt, and accelerates the rotation of the substrate to a third rotational speed higher than the second rotational speed to spin off a residue of the resist solution.

22 Claims, 8 Drawing Sheets

RESIST COATING METHOD AND RESIST COATING APPARATUS

BACKGROUND OF THE INVENTION

1. Field of the Invention

The present invention relates to a resist coating method and a resist coating apparatus which apply or coat a resist solution to a substrate to be processed like a semiconductor wafer.

2. Description of the Related Art

A photolithographic process step in a semiconductor device manufacturing process includes, for example, a resist coating step for forming a resist film on a semiconductor wafer and a developing step for developing a resist-coated wafer after an exposure process is performed on the resist-coated wafer. A spin coating method is widely used in the resist coating step to coat a resist solution uniformly over the wafer surface.

According to the spin coating method, a semiconductor wafer is rotated together with a spin chuck by rotational drive means with the semiconductor wafer vacuum-fixed on the spin chuck, and a resist nozzle positioned above the semiconductor wafer drops a resist solution onto the center of the wafer surface. The dropped resist solution spreads radially outward toward the circumference of the semiconductor wafer by centrifugal force. Although the dropping of the resist solution is terminated thereafter, the semiconductor wafer is continuously rotated while decreasing the rotational speed to spin off and dry the resist solution spread over the wafer surface.

Recently, reduction of resist consumption, i.e., reduction of the amount of the resist solution dropped on a wafer is strongly desired from the viewpoint of reducing the manufacturing cost or the like. When the amount of the resist solution dropped on a wafer is relatively large, the thickness of a coated film is easily adjustable to ensure a uniform thickness. When the amount of the resist solution dropped on the wafer is reduced, however, even if the conventional spin coating method can coat the resist solution to the entire wafer surface, the adjustment of the thickness of a coated film is difficult, making it difficult to achieve the uniform thickness. Specifically, with a small amount of the resist solution dropped on the wafer, as drying the resist solution rapidly progresses before the dropped resist solution sufficiently spreads toward the circumference of the wafer, raising a problem on the distribution of the thicknesses of the coated film such that the thickness of the outer circumference portion of the wafer is thinner than that of the central portion thereof. Accordingly, adjustment of the thickness is difficult, making it difficult for the coated film to have a uniform predetermined thickness.

As a method of adjusting the thickness of a coated film uniformly even with a reduced amount of a resist solution dropped, Japanese Patent Laid-open Publication No. H11-260717 discloses a resist coating method that includes a step of applying (coating) a resist solution to a target substrate to be processed while spreading the resist solution radially outward toward the circumference of the target substrate by supplying the resist solution to the approximate center of the target substrate while rotating the target substrate at a first rotational speed, a step of adjusting the thickness of the coated film by reducing the rotational speed of the target substrate to a second rotational speed lower than the first rotational speed after supply of the resist film is terminated, and a step of spinning off a residue of the resist solution by accelerating the rotational speed of the target substrate to a third rotational speed higher than the second rotational speed.

The method disclosed in the publication is excellent in that the thickness of the resist film can be made uniform over the entire target substrate even if the supply amount of the resist solution is significantly reduced. Recently, reduction in the supply amount of the resist solution is demanded more than ever, and there is a demand to reduce the supply amount of the resist solution by even a tiny amount of 1/10 ml. However, because the method disclosed in Japanese Patent Laid-open Publication No. H11-260717 rapidly decelerates the rotation of the target substrate from the first rotational speed to the second rotational speed, a deceleration shock causes the resist solution that is spreading around the wafer surface to return from the outer circumference of the wafer toward the center thereof. This increases the supply amount of the resist solution even slightly (for example, 0.1 ml or so). That is, the method disclosed in the publication allows the excess resist solution to realize the uniformity of the thickness of the coated film even if the amount of the excess resist is minimal. From the standpoint of reducing the supply amount of the resist solution, there still is a room for improvement.

BRIEF SUMMARY OF THE INVENTION

It is an object of the invention to provide a resist coating method and a resist coating apparatus which can reduce the supply amount of a resist solution as much as possible while making the thickness of a coated film uniform.

According to the first aspect of the invention, there is provided a resist coating method comprising:

supplying a resist solution to substantially a center of a target substrate to be processed while rotating said target substrate at a first rotational speed;

decelerating rotation of said target substrate to a second rotational speed lower than said first rotational speed or until rotational halt after supply of said resist solution is terminated, with making a deceleration smaller in a deceleration process as said rotational speed becomes closer to said second rotational speed or said rotational halt; and accelerating said rotation of said target substrate to a third rotational speed higher than said second rotational speed to spin off a residue of said resist solution.

According to the second aspect of the invention, there is provided a resist coating apparatus which supplies and coats a resist solution onto a rotating target substrate to be processed, comprising:

a substrate holding member which holds said target substrate;

rotation means which rotates said substrate holding member at a variable speed;

a resist solution nozzle which supplies said resist solution to substantially a center of said target substrate held by said substrate holding member; and control means which controls to start supplying said resist solution while rotating said substrate holding member holding said target substrate at a first rotational speed, decreasing a rotational speed of said substrate holding member to a second rotational speed lower than said first rotational speed or until rotational halt after supply of said resist solution is terminated, then accelerating rotation of said substrate holding member to a third rotational speed higher than said second speed, controlling rotation of said substrate holding member to spin off a residue of said resist solution, and controlling said rotational speed of said substrate holding member in such a way that a deceleration from said first rotational speed to said second rotational speed or said rotational halt becomes smaller as said rotational speed becomes close to said second rotational speed or said rotational halt.

According to the third aspect of the invention, there is provided a computer-readable storage medium storing a control program that, when executed, works a computer to control a resist coating apparatus using a resist coating method, the method comprising:

supplying a resist solution to substantially a center of a target substrate to be processed while rotating said target substrate at a first rotational speed;

decelerating rotation of said target substrate to a second rotational speed lower than said first rotational speed or until rotational halt after supply of said resist solution is terminated, with making a deceleration smaller in a deceleration process as said rotational speed becomes closer to said second rotational speed or said rotational halt; and accelerating said rotation of said target substrate to a third rotational speed higher than said second rotational speed to spin off a residue of said resist solution.

DETAILED DESCRIPTION OF THE INVENTION

Figure 1:
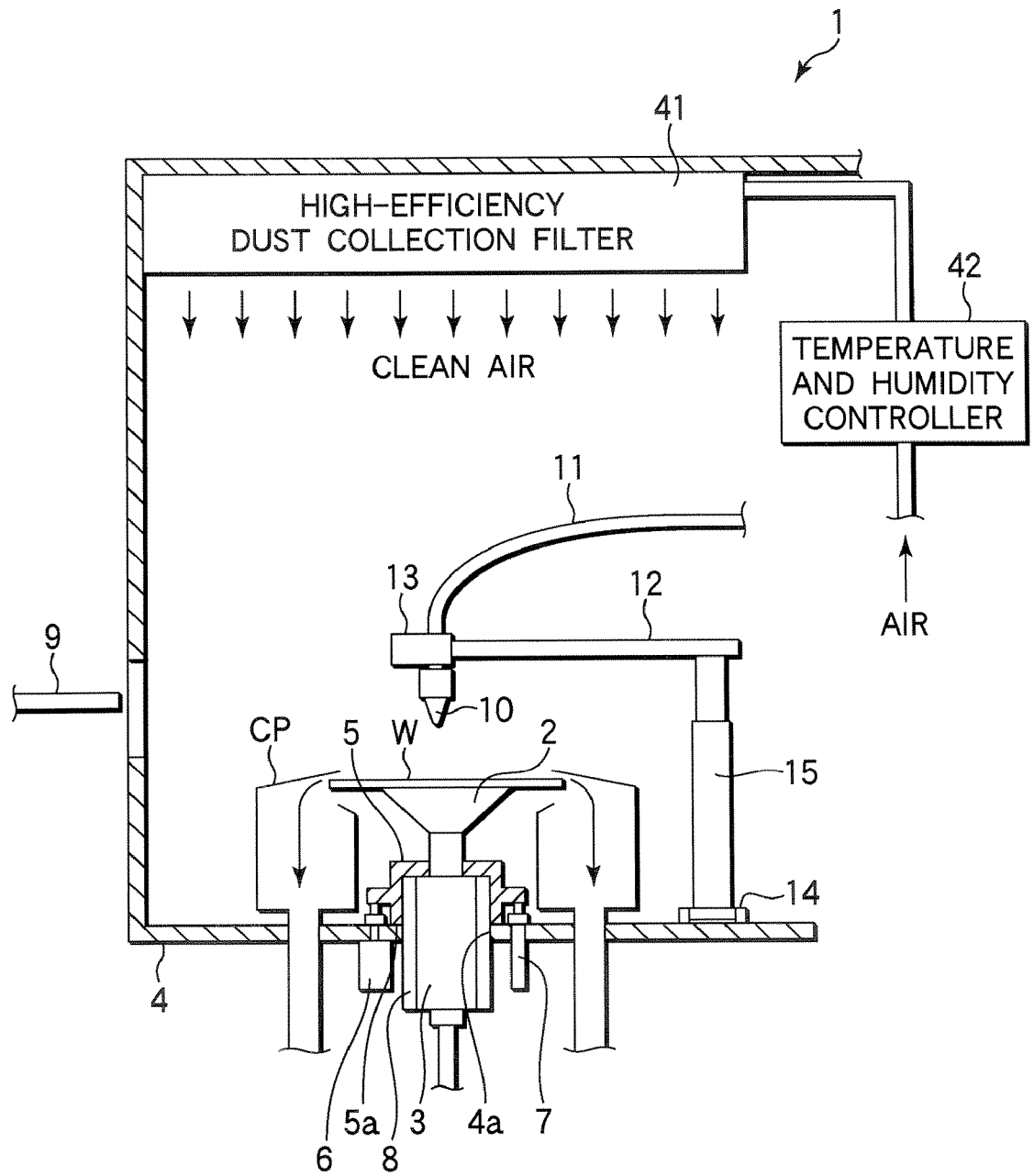
FIG. 1 is a cross-sectional view showing the general structure of a resist coating apparatus.
Figure 2:
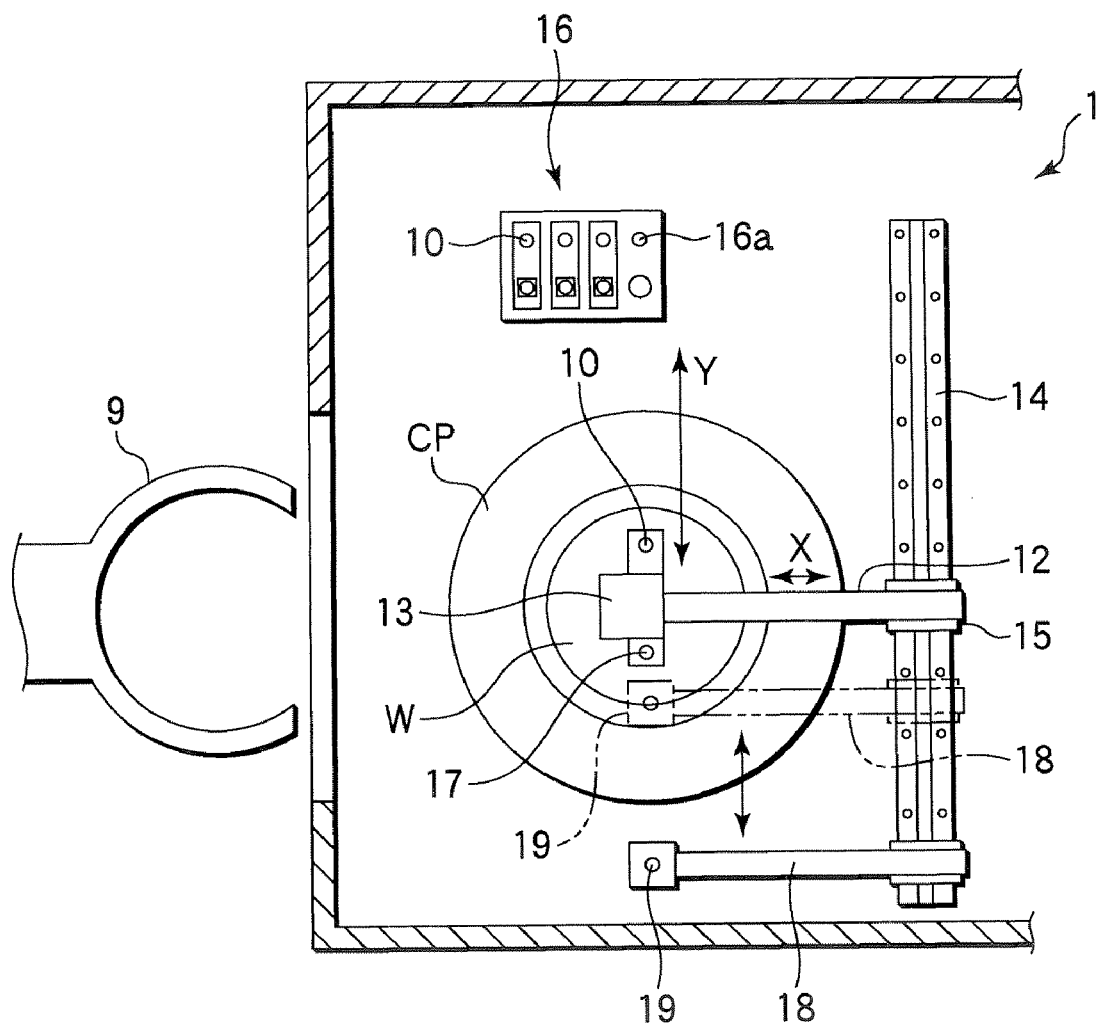
FIG. 2 is a top plan view of the resist coating apparatus shown in FIG. 1.

A preferred embodiment of the invention will be explained with reference to the accompanying drawings. FIGS. 1 and 2 are cross-sectional view and a top plan view showing the general structure of a resist coating unit (COT) 1 according to one embodiment of the invention. A circular cup CP is disposed at the center of the resist coating unit (COT) 1. A spin chuck 2 is disposed within the cup CP. The spin chuck 2 is rotated by a drive motor 3 with a semiconductor wafer (hereinafter, referred to as "wafer") W vacuum-adsorbed on the spin chuck 2. The drive motor 3 is disposed in an opening 4a provided in a unit bottom plate 4 in an elevatable manner, and is coupled to an up-and-down drive unit 6 comprising, for example, an air cylinder, and an up-and-down guide unit 7 through a cap-form flange member 5 made of, for example, aluminum. A cylindrical cooling jacket 8 made of, for example, stainless steel (SUS) is attached to the side face of the motor 3. The flange member 5 is attached so as to cover the upper half portion of the cooling jacket 8.

In applying a resist solution, a bottom end 5a of the flange member 5 come in close contact with the unit bottom plate 4 in the vicinity of the outer circumference of the opening 4a, thereby tightly sealing the interior of the unit. When the wafer W is delivered between the spin chuck 2 and a holding member 9 of a wafer transfer mechanism (not shown), the up-and-down drive unit 6 lifts the drive motor 3 or the spin chuck 2 upwards, so that the bottom end 5a of the flange member 5 comes upwards from the unit bottom plate 4.

A resist nozzle 10 for supplying a resist solution to the surface of the wafer W is connected to a resist supplier (to be discussed later) through a resist feed pipe 11. The resist nozzle 10 is removably attached to the leading end of a resist nozzle scan arm 12 through a nozzle holder 13. The resist nozzle scan arm 12 is mounted at the upper end portion of a vertical support member 15 horizontally movable on a guide rail 14 provided on the unit bottom plate 4 in one direction (Y direction). The resist nozzle scan arm 12 therefore moves in the Y direction together with the vertical support member 15 by a Y-direction drive mechanism (not shown).

To selectively mount the resist nozzle 10 at a resist nozzle standby unit 16, the resist nozzle scan arm 12 is also movable in an X direction orthogonal to the Y direction by an X-direction drive mechanism (not shown).

The discharge outlet of the resist nozzle 10 is inserted into an opening 16a of a solvent atmosphere chamber at the resist nozzle standby unit 16, and exposed to the solvent atmosphere, thereby preventing the resist solution at the leading end of the nozzle from being solidified or deteriorated. A plurality of resist nozzles 10 are provided, and used individually according to the kinds of resist solutions in use.

A solvent nozzle 17, which supplies a solvent like a thinner for wetting the wafer surface prior to supply of the resist solution to the wafer surface, is mounted at the leading end of the resist nozzle scan arm 12 (nozzle holder 13). The solvent nozzle 17 is connected to a solvent supplier (to be discussed later) through a solvent feed pipe (not shown). The solvent nozzle 17 and the resist nozzle 10 are mounted in such a way that the respective discharge outlets thereof are positioned in line along the Y direction of the resist nozzle scan arm 12.

In addition to the vertical support member 15 that supports the resist nozzle scan arm 12, a vertical support member (not shown) that supports a rinse nozzle scan arm 18 and is movable in the Y direction is provided on the guide rail 14. A rinse nozzle 19 for a side rinse is mounted at the leading end of the rinse nozzle scan arm 18. The Y-direction drive mechanism (not shown) causes the rinse nozzle scan arm 18 and the rinse nozzle 19 to move in parallel or in line between a rinse nozzle standby position (indicated by a solid line) set sideward of the cup CP and a rinse solution discharge position (indicated by a double dashed line) set directly above the circumference of the wafer W mounted on the spin chuck 2.

A high-efficiency dust collection filter 41 is provided above the wafer W. Air whose temperature and humidity are adjusted by a temperature and humidity controller 42 passes through the high-efficiency dust collection filter 41 to remove dust, so that clean air is supplied into the resist coating unit (COT) 1. Note that a gas containing, for example, a solvent for the resist solution may be introduced instead of air.

Figure 3:
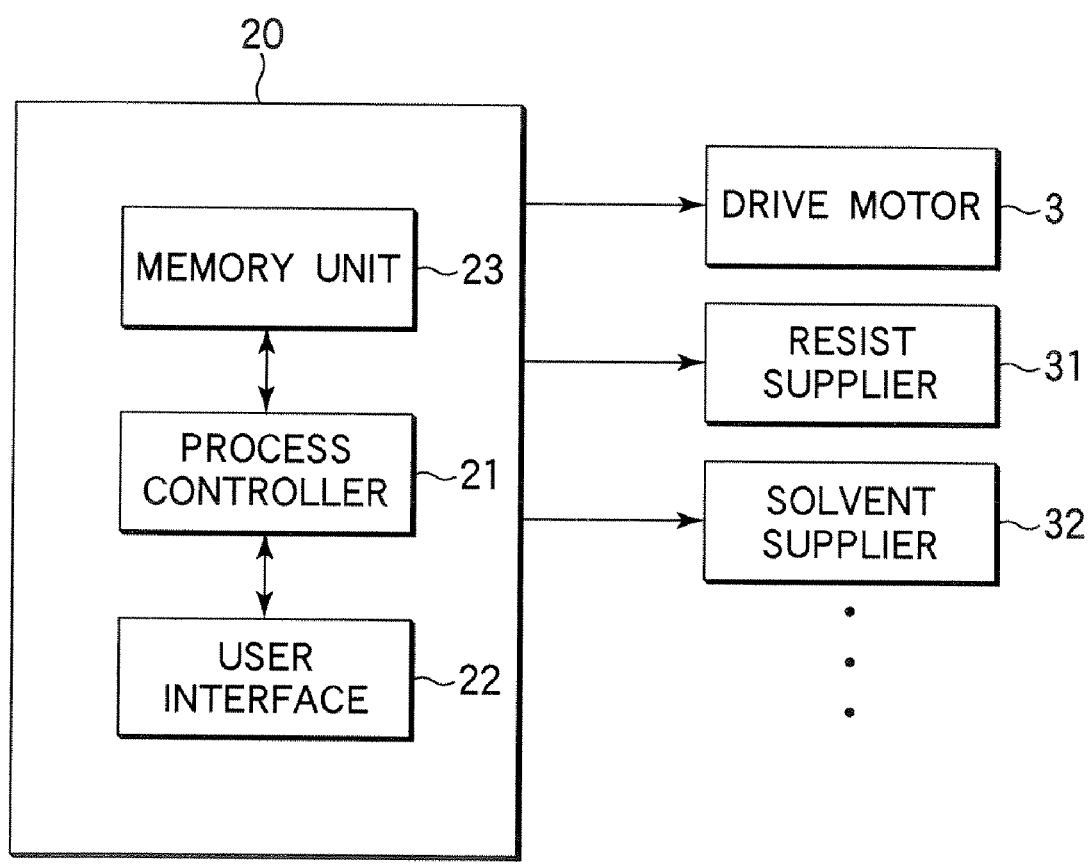
FIG. 3 is a diagram showing the structure of a control system of the resist coating apparatus shown in FIG. 1.

FIG. 3 is a diagram showing the structure of a control system of the resist coating unit (COT) 1. Individual structural portions of the resist coating unit (COT) 1 are connected to a controller 20 to be controlled by the controller 20.

The controller 20 has a process controller 21 that includes a CPU, a user interface 22, and a memory unit 23. The user interface 22 is connected to the process controller 21, and comprises a keyboard for allowing a process manager to perform a command input operation or the like to control the resist coating unit (COT) 1, a display that indicates the visualized operation status of the resist coating unit (COT) 1. The memory unit 23, connected to the process controller 21, stores a control program (software) for realizing various processes to be executed by the resist coating unit (COT) 1 under the control of the process controller 21, and recipes recording plural pieces of process condition data or the like.

As an arbitrary recipe is called up by an instruction or the like input through the user interface 22 as needed, and executed by the process controller 21, the resist coating unit (COT) 1 executes a desired process under the control of the process controller 21. The controller 20 controls, for example, driving of the drive motor 3, a resist supplier 31, and a solvent supplier 32. Specifically, the controller 20 controls the drive motor 3 so as to gradually decrease the rotational speed thereof. The controller 20 also controls a timing of supplying the resist solution from the resist supplier 31 to the resist nozzle 10, a timing of supplying a solvent like a thinner from the solvent supplier 32 to the solvent nozzle 17, and the amounts of the resist solution and the solvent to be supplied.

The control program and recipes for the process condition data can be those stored in a computer-readable memory medium, such as a CD-ROM, a hard disk, a flexible disk or a flash memory, or can be transmitted online from another apparatus via an exclusive line for use as needed.

Next, an explanation will be given of a resist coating operation of the thus structured resist coating unit (COT) 1.

As a wafer W is transferred to above the cup CP in the resist coating unit (COT) 1 by the holding member 9 of the wafer transfer mechanism (not shown), the wafer W is vacuum-adsorbed on the spin chuck 2 lifted upwards by the up-and-down drive unit 6 comprising, for example, an air cylinder, and the up-and-down guide unit 7. After vacuum-adsorbing the wafer W on the spin chuck 2, the wafer transfer mechanism moves the holding member 9 backwards from the interior of the resist coating unit (COT) 1 to terminate the transfer of the wafer W to the resist coating unit (COT) 1.

Next, the spin chuck 2 is lifted downwards until the wafer W comes to a home position in the cup CP. Subsequently, the drive motor 3 starts rotating the spin chuck 2. Thereafter, the nozzle holder 13 starts moving from the resist nozzle standby unit 16. The nozzle holder 13 moves along the Y direction.

When the discharge outlet of the solvent nozzle 17 reaches above the center of the spin chuck 2 (the center of the wafer W), the solvent like a thinner is supplied to the surface of the rotating wafer W. The solvent supplied to the wafer surface uniformly spreads from the center of the wafer W to the entire periphery thereof by centrifugal force.

Next, the nozzle holder 13 moves in the Y direction until the discharge outlet of the resist nozzle 10 reaches above the center of the spin chuck 2 (the center of the wafer W). The resist solution is dropped from the discharge outlet of the resist nozzle 10 to the center of the rotating wafer W to be coated onto the wafer surface.

Figure 4:
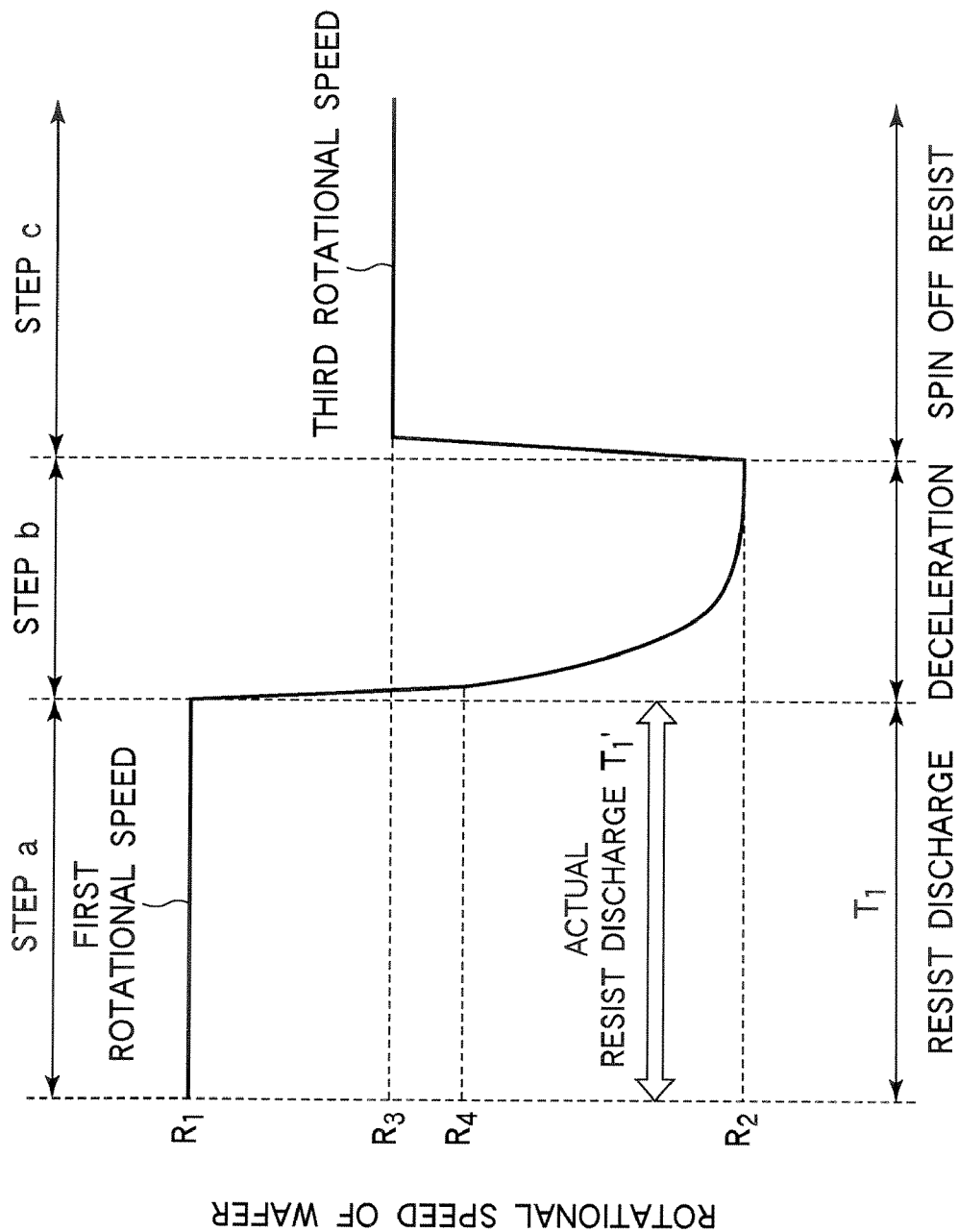
FIG. 4 is a timing chart showing the states of rotational control by the resist coating apparatus shown in FIG. 1.

In the embodiment, the rotational speed of the wafer W (i.e., the number of rotations of the drive motor 3) is controlled by the controller 20, and as shown in, for example, a timing chart in FIG. 4, the following steps a to c are executed.

Step a:

The resist solution is coated onto the wafer W by dropping the resist solution on the approximate center of the wafer W from the resist nozzle 10 and spreading the resist solution on the wafer W radially outward toward the circumference of the wafer W while rotating the wafer W at a first rotational speed $R_1$. A time of discharging the resist solution in this step is set as $T_1$.

Step b:

After the dropping of the resist solution is finished, the rotational speed of the wafer W is gradually decreased to a second rotational speed $R_2$ lower than the first rotational speed $R_1$. At this time, control is performed in such a way that the closer to the second rotational speed $R_2$ the rotational speed becomes, the smaller the deceleration becomes.

Step c:

Thereafter, the rotational speed of the wafer W is increased to a third rotational speed $R_3$ higher than the second rotational speed $R_2$ to spin off the residue of the resist solution.

The step a is so-called dynamic coating which supplies the resist solution to near the center of the wafer W while rotating the wafer W. In the step a, as the resist is coated while the wafer W is rotated, it is possible to form a resist film uniformly on the surface of the wafer W with an extremely small resist amount.

In the step b, after the dropping of the resist solution is finished, the rotational speed of the wafer W is gradually reduced to the second rotational speed $R_2$ lower than the first rotational speed $R_1$. At this time, the rotational speed is gradually reduced in such a way that, in a chart indicating a correlation between rotational speeds and times in deceleration which are exemplified in FIG. 4, reduction in rotational speed progresses like a convex curve facing substantially downwards. That is, the deceleration in reducing the rotational speed from the first rotational speed $R_1$ to the second rotational speed $R_2$ is made smaller as the rotational speed comes closer to the second rotational speed $R_2$. As the rotational speed is reduced linearly and rapidly at a constant deceleration from the first rotational speed $R_1$ to the lower second rotational speed $R_2$, inertial force is applied at the time of the deceleration, and force toward the center of the wafer W is applied to the resist solution on the wafer W. This makes it necessary to feed an excess resist solution, slightly though it is, so that consumption of the resist solution becomes larger by what corresponds to the amount of the excess resist solution. However, rapid reduction in rotational speed is avoided by gradually reducing the rotational speed of the wafer W and gradually reducing the deceleration speed. This eases the deceleration-oriented action of returning the resist solution on the wafer W to the center thereof, making it possible to save the supply amount of the resist solution.

In the step b, the deceleration is further reduced in the last half of the step of reducing the rotational speed from the first rotational speed $R_1$ to the second rotational speed $R_2$. That is, as the deceleration is reduced in such a way that, in the chart indicating the correlation between rotational speeds and times in the deceleration which are exemplified in FIG. 4, the slope of a tangential line of a curve of the decreasing rotational speed gradually approaches a horizontal line, thereby providing a thickness adjustment action as done in the case where the rotational speed is kept at the lower second rotational speed $R_2$ for a predetermined time. As the rotational speed gradually comes closer to the second rotational speed $R_2$ in the deceleration process in this manner, the drying of the resist solution becomes slower because the low rotational speed of the wafer W. Accordingly, the fluidity of the resist solution is kept and the function of adjusting the thickness of a film is demonstrated to adjust the thickness of a resist film on the wafer W, in particular, the thickness of the resist film at the circumference of the wafer W.

That is, as the drying of the resist film is suppressed by the low rotational speed to keep the fluidity of the resist solution, a resist can be held at the circumference of the wafer W as well as on the center thereof.

In the step c, the rotational speed of the wafer W is increased to the third rotational speed $R_3$ higher than the second rotational speed $R_2$ to spin off the excess of the resist solution.

A spin coating method according to the embodiment will be explained in comparison with resist coating methods of other schemes.

Figure 5A:
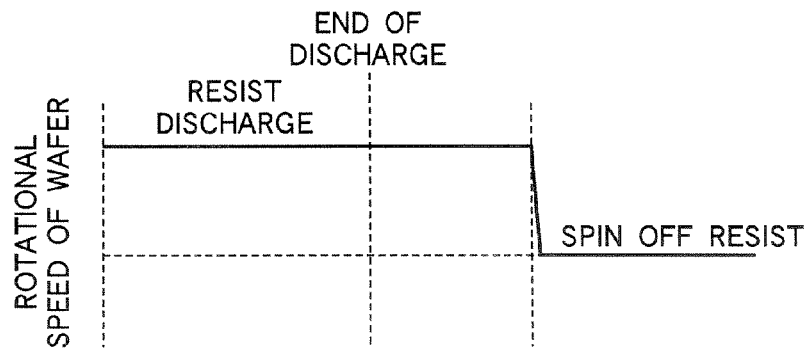
FIGS. 5A and 5B are diagrams for explaining rotational controls by comparative methods.
Figure 5B:
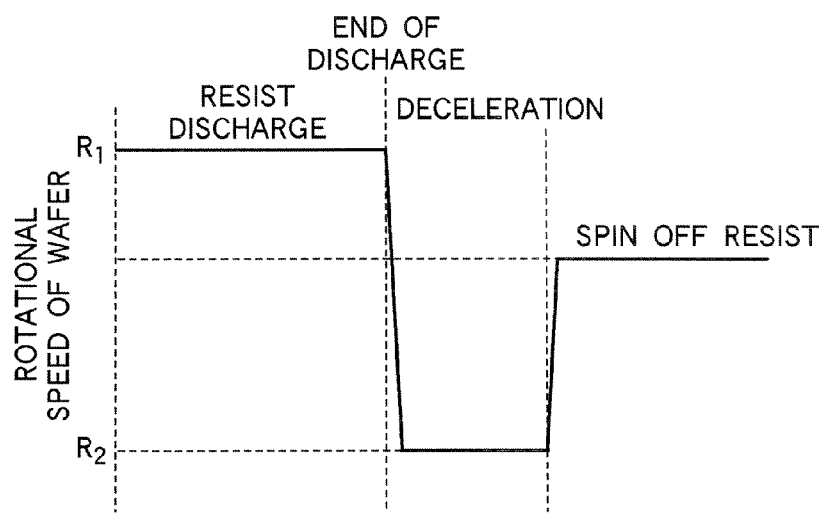

In a rotational control method shown in FIG. 5A, i.e., a spin coating method which spins off the residue of the resist solution while maintaining the rotational speed of the wafer W without deceleration after the dropping of the resist solution, when the amount of the resist solution dropped to the wafer W is reduced, the drying of the resist solution progresses fast before the dropped resist solution sufficiently spreads radially outward toward the circumference of the wafer W. Accordingly, the applied film has a thickness distribution such that the thickness of the film at the circumference of the wafer W is thinner than that of the film at the center of the wafer W, thus making it difficult to adjust the film thickness. If the rotational speed is reduced from the first rotational speed $R_1$ to the second rotational speed $R_2$ at once as shown in FIG. 5B, for example, to avoid such difficulty, the deceleration at the time of reducing the rotational speed causes returning force toward the center of the wafer W to the resist solution on the wafer W, and suppresses the resist solution from spreading thinly. This requires that the supply amount of the resist solution should be increased by what corresponds to the suppression.

Figure 5C:
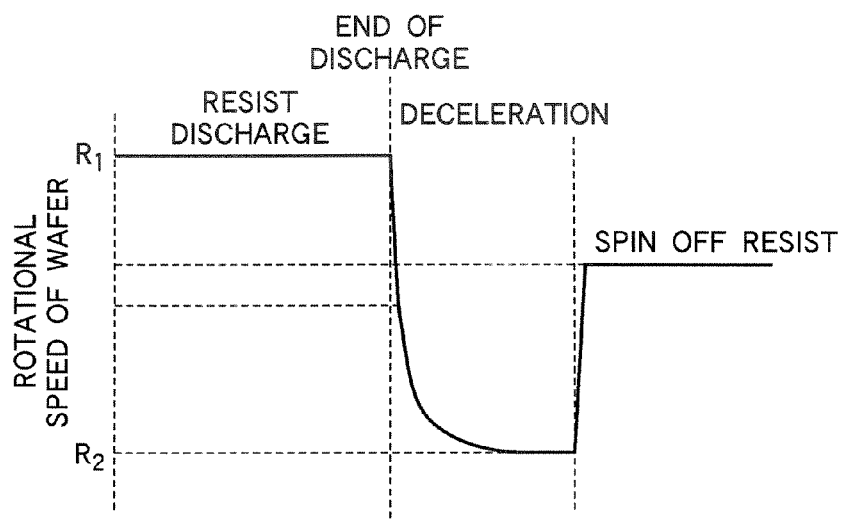
FIG. 5C is a diagram for explaining rotational control by a method of the invention.

In the spin coating method according to the embodiment, by way of contrast, as shown in FIG. 5c, the rotational speed is gradually reduced from the first rotational speed $R_1$ to the second rotational speed $R_2$ in the coating process in such a way that the deceleration becomes smaller as the rotational speed approaches the second rotational speed $R_2$, the returning force toward the center of the wafer is suppressed thereby. Therefore, it is not necessary to set the supply amount of the resist solution excessively. Because it is possible to adjust the thickness of the resist film on the wafer W as the rotational speed approaches the lower second rotational speed $R_2$, the resist film at the circumference of the wafer W can be made sufficient thickness. Thus, the coated resist solution can stay on the circumference of the wafer W as well as at the center thereof, making it possible to spread a resist film having a predetermined uniform thickness over the entire wafer W. Therefore, it is possible to adjust the thicknesses of the coated films on wafers to a uniform predetermined thickness while reducing the amount of the resist solution dropped on each wafer W as much as possible. The spin coating method according to the embodiment which gradually reduces the rotational speed in such a way as not to cause a rapid change in deceleration is extremely superior in that the consumption amount of the resist solution can be minimized.

In FIG. 4, deceleration takes place from the first rotational speed $R_1$ to the second rotational speed $R_2$. However, the second rotational speed $R_2$ may be replaced with a rotation stop state (rotational speed=0 rpm). In this case, a function of adjusting the thickness of the film by gradual reduction in deceleration and an effect of reducing the supply amount of the resist solution can also be obtained.

Figure 6:
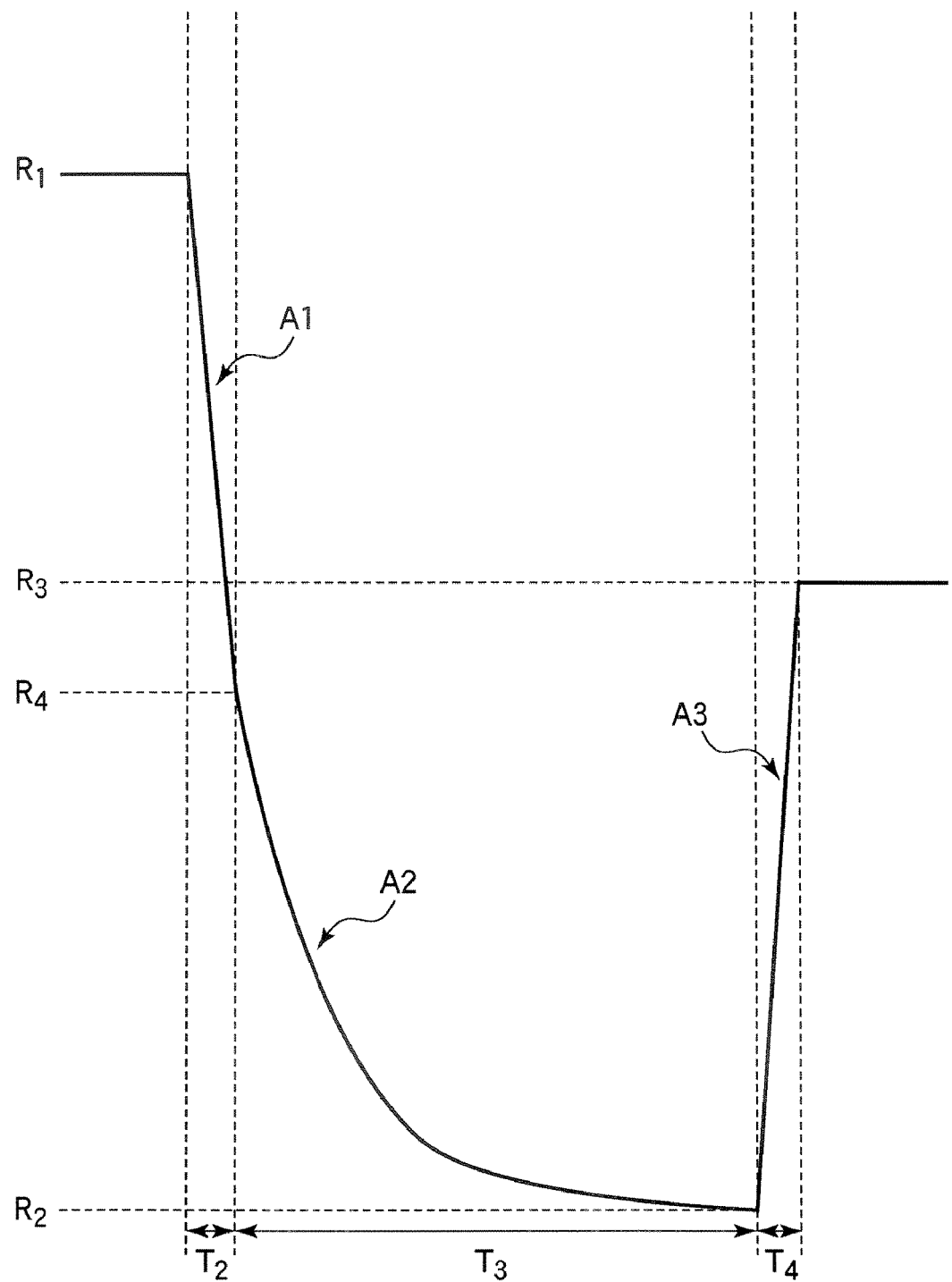
FIG. 6 is an enlarged view of the essential part of the timing chart of FIG. 4.

As shown in FIG. 6, in the deceleration from the first rotational speed $R_1$ to the second rotational speed $R_2$, let A1 be an average deceleration in an initial deceleration step to a fourth rotational speed $R_4$, let $T_2$ be a time necessary for the initial deceleration step, let A2 be an average deceleration in a later deceleration step of reducing the rotational speed from the fourth rotational speed $R_4$ to the second rotational speed $R_2$, let $T_3$ be a time necessary for this later deceleration step, let A3 be an acceleration when the rotational speed is increased from the rotational speed $R_2$ to the rotational speed $R_3$, and let $T_4$ be a time necessary for this acceleration.

While the first to fourth rotational speeds can be appropriately set according to the kind of the resist solution in use, presence/absence of a solvent pre-coat, the diameter of the wafer W, and so forth, it is preferable to set the rotational speed as follows.

The first rotational speed $R_1$ is set to such a rotational speed that the resist solution discharged to the vicinity of the center of the rotating wafer W does not spin off at once but spreads over the surface of the wafer W uniformly. In a case where the diameter of the wafer W is 200 mm, it is preferable to set the first rotational speed $R_1$ to, for example, 3000 to 6000 rpm. In a case where the diameter of the wafer W is 300 mm, it is preferable to set the first rotational speed $R_1$ to 2000 to 4000 rpm.

As mentioned above, the reason why the rotational speed is decreased from the first rotational speed $R_1$ to the second rotational speed $R_2$ over a predetermined time $T_2+T_3$ by gradually reducing the deceleration is to adjust the film thickness of the coated resist solution prior to drying by rotating the wafer W, with appropriate centrifugal force applied thereto, at a rotational speed low enough not to spin off the resist solution on the wafer W. Therefore, if the second rotational speed $R_2$ is too high, the drying of the resist solution progresses, making it impossible to adjust the thickness distribution at a rotational speed near the second rotational speed $R_2$. From such a standpoint, it is preferable that the second rotational speed $R_2$ should be set to or less than 500 rpm, for example, $R_2$=0 (rotation stopped) to 500 rpm. In the embodiment, because the deceleration is gradually reduced as the rotational speed approaches the rotational speed $R_2$, the function of adjusting the thickness of the film can be demonstrated during the speed reduction. Therefore, the second rotational speed $R_2$ can be set to $R_2$=0 rpm (rotational halt).

The thickness of the film can be adjusted by controlling the airflow of clean air supplied through the high-efficiency dust collection filter 41 above the wafer W. In this case, gas supplied from the high-efficiency dust collection filter 41 is not limited to air, but may be a gas containing, for example, a solvent for the resist solution (for example, air and $N_2$ gas). This makes it possible to set a solvent atmosphere in the resist coating unit (COT) 1, so that the drying of the resist solution can be further delayed.

The clean air or the solvent-containing gas may be supplied in, for example, the deceleration process from the first rotational speed $R_1$ to the second rotational speed $R_2$ (time $T_2+T_3$), or may be supplied only in the later deceleration process (time $T_3$). Alternatively, the gas or the like can be kept supplied through a sequence of processes including the step of spinning off the resist solution at the third rotational speed $R_3$ to be executed later. From the standpoint of obtaining a high thickness adjustment effect, it is preferable that the gas or the like should be supplied in a process including at least the later deceleration process (time $T_3$).

The third rotational speed $R_3$ is set in such a way as to provide centrifugal force sufficient to spin off the excess resist solution on the surface of the wafer W from the periphery of the wafer W. From this viewpoint, when the diameter of the wafer W is 200 mm, it is preferable to set the third rotational speed $R_3$ to, for example, 1500 to 4000 rpm. When the diameter of the wafer W is 300 mm, it is preferable to set the third rotational speed $R_3$ to, for example, 750 to 2000 rpm. The third rotational speed $R_3$ is normally lower than the first rotational speed $R_1$, but can be set higher than the first rotational speed $R_1$.

The fourth rotational speed $R_4$ is a transition point in the deceleration step, and is set to a rotational speed that provides some difference between the first rotational speed $R_1$ and the fourth rotational speed $R_4$ so that the entire deceleration time (the time of the step b) is not prolonged.

Furthermore, the fourth rotational speed $R_4$ is set in such a way as to provide some difference between the second rotational speed $R_2$ and the fourth rotational speed $R_4$ so that the deceleration can be made smaller gradually as the rotational speed approaches the second rotational speed $R_2$. From those viewpoints, it is preferable to set the fourth rotational speed $R_4$ to or less than 2000 rpm, for example, 500 to 2000 rpm.

When the average decelerations A1 and A2 in the deceleration step from the first rotational speed $R_1$ to the second rotational speed $R_2$ are too small, a total time $T_2+T_3$ until the deceleration to the second rotational speed $R_2$ becomes long, and the drying of the applied resist solution progresses too much, making it difficult to form a uniform coated film. Therefore, it is preferable that the deceleration A1 should be set less than or equal to 50000 rpm/sec, for example, 20000 to 50000 rpm/sec. It is preferable that the deceleration A2 should be set less than or equal to 5000 rpm/sec, for example, 1000 to 5000 rpm/sec.

The deceleration time $T_2+T_3$ of reducing the rotational speed from the first rotational speed $R_1$ to the second rotational speed $R_2$ is set to such a time that the resist solution, which is discharged onto the surface of the wafer W, slowly spreads radially outward toward the circumference of the wafer W to adjust the film thickness while the rotational speed is gradually reduced, does not spread over the entire surface of the wafer W nor dry out, and such a time that the throughput is not impaired. Thus, the deceleration time $T_2$ is preferably set to or less than 0.2 sec, and the deceleration time $T_3$ can be set to or less than 2.0 sec, preferably, 0.5 to 2.0 sec. The total deceleration time $T_2+T_3$ can be set to or less than, for example, 3 sec, preferably, 1 to 2 sec.

As explained above, controlling the coating condition with the first rotational speed $R_1$, the second rotational speed $R_2$, the fourth rotational speed $R_4$, the deceleration times $T_2$ and $T_3$, and the decelerations A1 and A2 taken as parameters can ensure film thickness adjustment with a high degree of freedom.

The film thickness can also be adjusted by changing the A3 when the rotational speed is increased from the second rotational speed $R_2$ to the third rotational speed $R_3$. That is, after the rotation at the second rotational speed $R_2$ is finished, the resist solution has not been dried yet, the film thickness can be changed by changing the A3. Specifically, the smaller the A3 is, the thicker the film on the periphery of the wafer W becomes. Therefore, controlling the film thickness with the A3 taken as a parameter in addition to the parameters can ensure film thickness adjustment with a higher degree of freedom. The A3 can be adjusted by an increase from the second rotational speed $R_2$ to the third rotational speed $R_3$ and the time $T_4$.

A timing at which the rotational speed of the wafer W is reduced from the first rotational speed $R_1$ to the second rotational speed $R_2$ normally comes after the discharge of the resist solution is finished, but preferably comes right after the end of the discharge of the resist solution as shown in FIG. 4. That is, it is preferable that the resist discharge time $T_1$ should be equal to an actual resist discharge time $T_1'$ and thus reduction in rotational speed should take place substantially the same time as the end of the resist discharge. If a high rotational speed is kept after the discharge is finished, the drying of the resist solution progresses, so that the film thickness adjustment function may not be achieved. If the rotational speed of the wafer W is reduced right after the supply of the resist solution is finished, on the other hand, it is possible to suppress the drying of the resist solution. This further facilitates adjustment of the film thickness, and prevents unevenness of the film on the surface of the wafer W.

Prior to the application of the resist solution, a so-called pre-wet process of wetting the entire surface of the wafer W with the solvent like a thinner can be executed. This makes it easier for the resist solution to spread, as a result of which a uniform resist film can be formed with a smaller amount of the resist solution, thus ensuring further reduction in the consumption of the resist solution.

Figure 7:
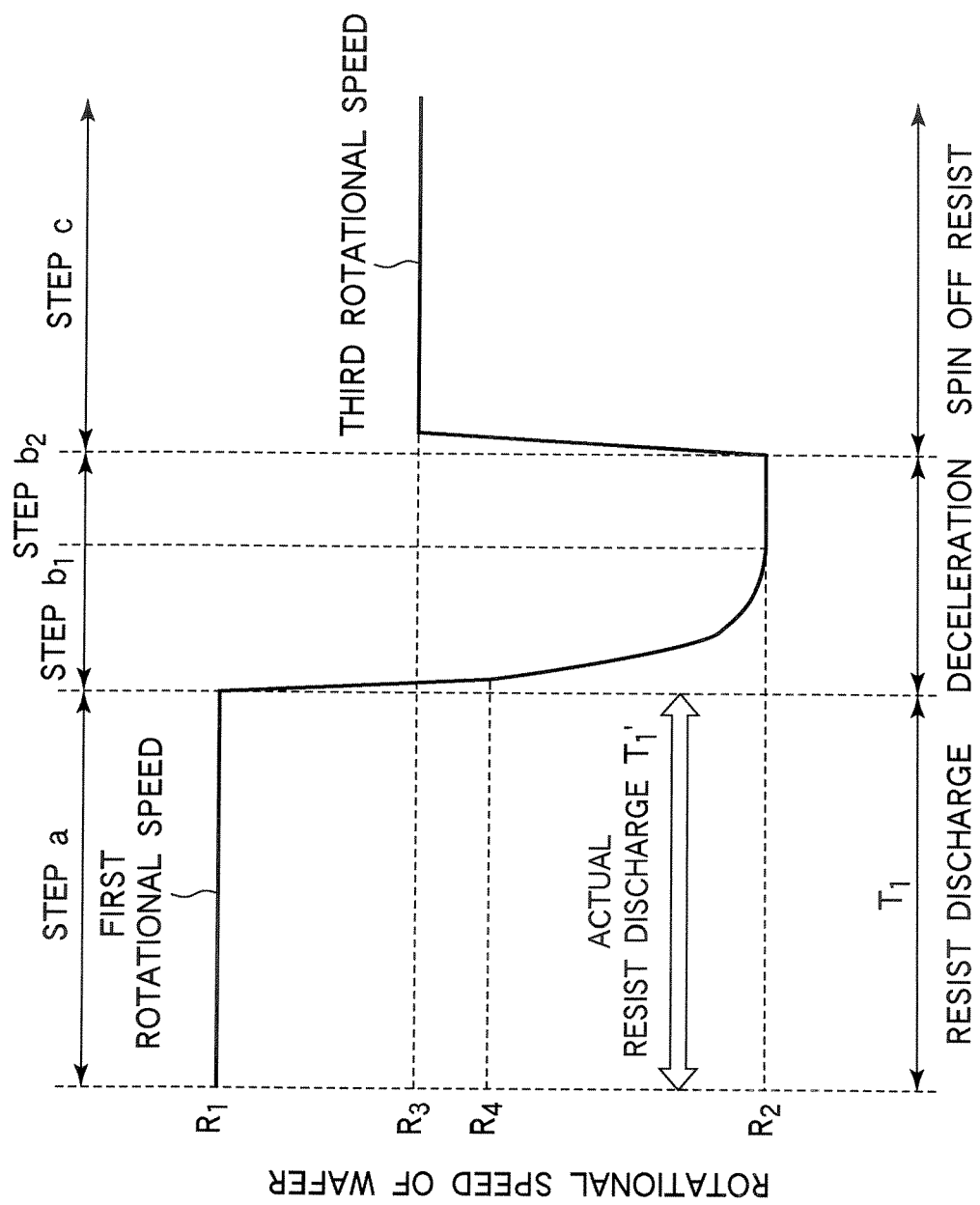
FIG. 7 is a timing chart showing another embodiment of rotational control by the resist coating apparatus shown in FIG. 1.

In the embodiment shown in FIG. 4, increasing the rotational speed to the third rotational speed $R_3$ is initiated right after the rotational speed is reduced to the second rotational speed $R_2$. It is however possible to provide a step $b_2$ of keeping the second rotational speed $R_2$ for a predetermined time after the rotational speed is reduced to the second rotational speed $R_2$ in a step $b_1$, as shown in FIG. 7. In this case, in the step $b_1$, after completion of the dropping of the resist solution, the rotational speed of the wafer W is reduced to the second rotational speed $R_2$ lower than the first rotational speed $R_1$ in such a way that the deceleration speed becomes smaller as the rotational speed comes closer to the second rotational speed $R_2$. When the rotational speed reaches the second rotational speed, the state is held for the predetermined time in the step $b_2$.

Because the step a and the step c are the same as those of the embodiment shown in FIG. 4, their explanations will be omitted.

As explained above, in the step $b_1$, the rotational speed of the wafer W is gradually reduced to the second rotational speed $R_2$ lower than the first rotational speed $R_1$ after dropping the resist solution is finished. At this time, the rotational speed is gradually reduced in such a way that, in the chart indicating a correlation between rotational speeds and times in deceleration which are exemplified in FIG. 7, the reduction in rotational speed progresses like a convex curve facing downwards. That is, the deceleration in reducing the rotational speed from the first rotational speed $R_1$ to the second rotational speed $R_2$ is made smaller as the rotational speed comes closer to the second rotational speed $R_2$. As the rotational speed is linearly and rapidly reduced to the lower second rotational speed $R_2$ from the first rotational speed $R_1$ at a constant deceleration, inertial force applied at the time of the deceleration, and force toward the center of the wafer W is applied to the resist solution on the wafer W. This makes it necessary to feed an excess resist solution, slightly though it is, so that the consumption of the resist solution becomes larger by what corresponds to the amount of the excess resist solution. However, rapid reduction in rotational speed is avoided by gradually reducing the rotational speed of the wafer W and gradually reducing the deceleration speed. This eases the deceleration-oriented action of returning the resist solution on the wafer W to the center thereof, so that the amount of the resist solution to be supplied can be saved.

In particular, in the last half of the step $b_1$, i.e., in the last half step of reducing the rotational speed from the first rotational speed $R_1$ to the second rotational speed $R_2$, the deceleration is further reduced. That is, the deceleration is reduced in such a way that, in the chart indicating the correlation between rotational speeds and times in deceleration which are exemplified in FIG. 7, the slope of the tangential line of the curve of the decreasing rotational speed gradually approaches a horizontal line, and is reduced to second rotational speed $R_2$ in such a manner as not to cause a rapid change in the rotational speed.

In the step $b_2$, the rotational speed is kept at the second rotational speed $R_2$ for the predetermined time. When the rotational speed is the second rotational speed $R_2$, the rotation of the wafer W is slow, so that the drying of the resist solution is slow. Accordingly, the function of adjusting the film thickness is demonstrated, and the thickness of the resist film on the wafer W, in particular, the film thickness at the periphery of the wafer W is adjusted.

That is, suppression of the drying of the resist film by slow rotation and keeping the fluidity of the resist solution make it possible to hold a resist at the periphery of the wafer W as well as at the center of the wafer W.

Figure 8:
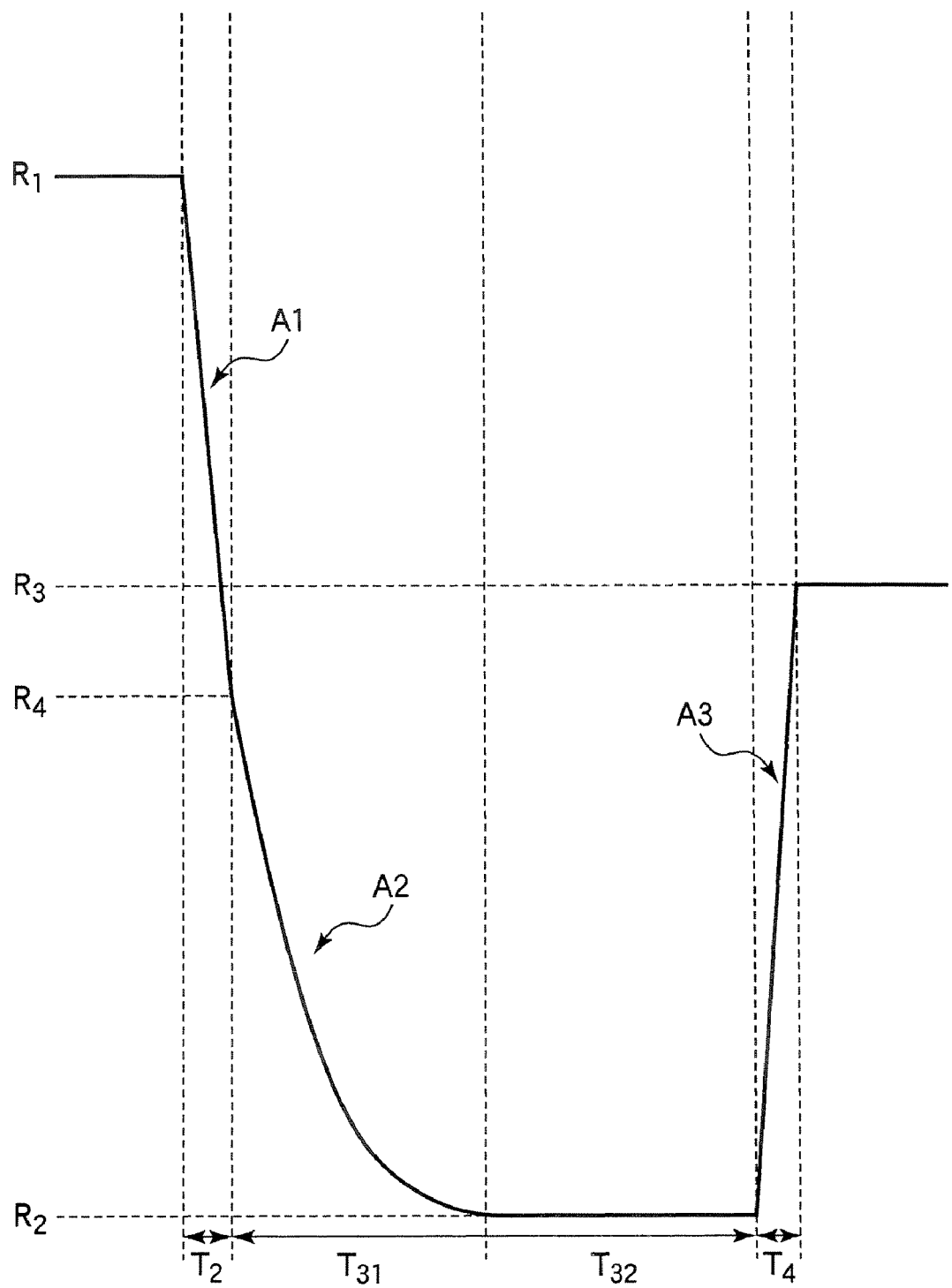
FIG. 8 is an enlarged view of the essential part of the timing chart of FIG. 7.

As shown in FIG. 8, in the deceleration from the first rotational speed $R_1$ to the second rotational speed $R_2$, let A1 be an average deceleration in an initial deceleration step until the rotational speed becomes the fourth rotational speed $R_4$, let $T_2$ be a time necessary for this initial deceleration step, let A2 be an average deceleration in a later deceleration step of reducing the rotational speed from the fourth rotational speed $R_4$ to the second rotational speed $R_2$, let $T_{31}$ be a time necessary for this later deceleration step, let $T_{32}$ be a time during which the second rotational speed $R_2$ is kept, let A3 be an acceleration when the rotational speed is increased to the third rotational speed $R_3$ from the second rotational speed $R_2$, and let $T_4$ be a time necessary for this acceleration.

While the first to fourth rotational speeds can be appropriately set according to the kind of the resist solution in use, presence/absence of a solvent pre-coat, the diameter of the wafer W, and so forth, it is preferable to set the rotational speed as follows. The first rotational speed $R_1$, the third rotational speed $R_3$, and the fourth rotational speed $R_4$ are set to the same rotational speeds as those of the embodiment in FIG. 4.

The reason why the second rotational speed $R_2$ is kept for a predetermined time ($T_{32}$) is to adjust the film thickness of the coated resist solution prior to drying by rotating the wafer W, with appropriate centrifugal force applied thereto, at a rotational speed low enough not to spin off the resist solution on the wafer W. Therefore, if the second rotational speed $R_2$ is too high, the drying of the resist solution progresses, and the fluidity thereof is lost, so that the function of adjusting the film thickness does not work well. When the second rotational speed $R_2$ is kept for the predetermined time as in this embodiment, if the second rotational speed $R_2$ is too low (for example, 0 rpm), the function of adjusting the film thickness does not work, and the film thickness at the periphery of the wafer W becomes thinner than the film thickness at the center of the wafer W. From such viewpoints, it is preferable that the second rotational speed $R_2$ should be set to or less than 500 rpm, for example, 100 to 500 rpm in the embodiment.

When the average decelerations A1 and A2 in the deceleration step from the first rotational speed $R_1$ to the second rotational speed $R_2$ are too small, the total time $T_2+T_{31}$ until the deceleration to the second rotational speed $R_2$ becomes long, and the drying of the applied resist solution progresses too much, making it difficult to form a uniform coated film. Therefore, it is preferable that the average deceleration A1 should be set less than or equal to 50000 rpm/sec, for example, 20000 to 50000 rpm/sec. It is preferable that the average deceleration A2 should be set less than or equal to 5000 rpm/sec, for example, 1000 to 5000 rpm/sec.

The total of the deceleration time $T_2+T_{31}$ from the first rotational speed $R_1$ to the second rotational speed $R_2$ and the time $T_{32}$ for keeping the second rotational speed $R_2$ is set to such a time that the resist solution, which is discharged onto the surface of the wafer W, slowly spreads radially outward toward the circumference of the wafer W to adjust the film thickness while the rotational speed is gradually reduced, does not spread over the entire surface of the wafer W nor dry out, and such a time that the throughput is not impaired. Accordingly, the deceleration time $T_2$ is preferably set to or less than 0.2 sec, and the deceleration time $T_{31}$ can be set to or less than, for example, 2.0 sec, preferably, 0.5 to 1.0 sec. The total deceleration time $T_2+T_{31}$ can be set to or less than, for example, 2.0 sec, preferably, 0.5 to 1.0 sec. The total time of the deceleration time $T_2+T_{31}$ and the time $T_{32}$ for keeping the second rotational speed $R_2$ should preferably be set to or less than, for example, 3 sec, and more preferably, 1 to 2 sec.

As explained above, film thickness adjustment with a high degree of freedom becomes possible by controlling the coating condition with the first rotational speed $R_1$, the second rotational speed $R_2$, the fourth rotational speed $R_4$, the deceleration times $T_2$ and $T_{31}$, the time $T_{32}$ for keeping the second rotational speed $R_2$, and the decelerations A1 and A2 taken as parameters.

The film thickness can be adjusted in the embodiment too by controlling the airflow of clean air supplied through the high-efficiency dust collection filter 41 above the wafer W. In this case, gas supplied through the high-efficiency dust collection filter 41 is not limited to air, and may be a gas containing, for example, the solvent for the resist solution (for example, air and $N_2$ gas). This makes it possible to set a solvent atmosphere in the resist coating unit (COT) 1, so that the drying of the resist solution can be further delayed.

Such clean air or solvent-containing gas may be supplied during the deceleration time ($T_2+T_{31}$) from the first rotational speed $R_1$ to the second rotational speed $R_2$, and may be supplied during the total time of the deceleration time ($T_2+T_{31}$) to the second rotational speed $R_2$ and the time ($T_{32}$) for keeping the second rotational speed $R_2$. The supply of the gas or the like can continue through a sequence of processes including the step of spinning off the resist solution at the third rotational speed $R_3$ to be executed later. From the standpoint of obtaining a high film thickness adjustment effect, it is preferable that the gas or the like should be supplied for a time including at least the time ($T_{32}$) for keeping the second rotational speed $R_2$.

As explained above, according to the preferable embodiments of the invention, in applying the resist solution while rotating the target substrate, when the rotational speed of the target substrate is decreased after the supply of the resist solution is finished, the deceleration in the deceleration step is made smaller as the rotational speed comes closer to the second rotational speed $R_2$ or the rotational halt, thereby reducing the amount of the resist solution to be used nearly to the limit while achieving uniform film thickness.

That is, as the deceleration is gradually reduced in the process of reducing the rotational speed to the second rotational speed $R_2$ lower than the first rotational speed $R_1$, or to the rotational halt, it is possible to suppress the rapid-deceleration oriented action of returning the resist solution toward inside (the center of) the substrate and avoid consumption of an excess resist solution. The film thickness can be made uniform by adjusting the film thickness in the gradual deceleration step in which the rotational speed reaches the second rotational speed or the rotational halt. Therefore, it is possible to apply the resist solution to a uniform film thickness while the amount of the supply of the resist solution is reduced as much as possible.

The present invention is not limited to the above-described embodiments, and can be modified in various other forms. For example, although the rotational speed is decreased to the second rotational speed $R_2$ right after the supply of the resist solution is terminated in the embodiments, it is not necessary to decrease the rotational speed right after the termination of the supply of the resist solution. As mentioned above, however, deceleration right after the termination of the supply of the resist solution can make the film thickness adjustment work further effectively, leading to a greater reduction in resist solution.

Although the deceleration is reduced in one step while gradually changing the rotational speed from the first rotational speed $R_1$ to the second rotational speed $R_2$ in the embodiments, the deceleration step may be set to two or more steps as long as the rapid-deceleration oriented action of returning the resist solution can be suppressed.

In the embodiments, a pre-wet process using a thinner is executed, but the advantageous effect of the invention can be provided even in a case where no pre-wet process is executed.

Further, although the foregoing descriptions of the embodiments have been given of a coating apparatus which applies a resist solution to a semiconductor wafer, the invention can also be applied to a case where the resist solution is applied to other substrates to be processed than a semiconductor wafer, e.g., an LCD substrate.

The above-explained embodiments are intended only to clarify the technical contents of the invention. The invention should not in any way be limited to such specific embodiments, but can be modified in various other forms within the spirit of the invention and the scope of the invention set out in the accompanying claims.

What is claimed is:

1. A resist coating method comprising:
   supplying a resist solution to substantially a center of a circular target substrate to be processed while rotating the target substrate at a first rotational speed of 2,000 rpm to 6,000 rpm during a supply period, and terminating supply of the resist solution at an end of the supply period such that the resist solution is kept not supplied onto the target substrate thereafter until residual parts of the resist solution have been spun off;
   rotating the target substrate while reducing a rotational speed thereof from the first rotational speed to a second rotational speed that is lower than the first rotational speed and that is 500 to 2,000 rpm with a first deceleration rate of 20,000 to 50,000 rpm/sec during a period from a first time point after the supply period to a second time point;
   rotating the target substrate while reducing a rotational speed thereof from the second rotational speed to a third rotational speed that is lower than the second rotational speed and that is 0 to 500 rpm or until rotational halt with a second deceleration rate of 1,000 to 5,000 rpm/sec during a period from the second time point to a third time point, the second deceleration rate gradually becoming smaller with a decrease in rotational speed of the target substrate, and the periods from the first time point to the third time point being 1 to 3 seconds in total; and
   rotating the target substrate while accelerating a rotational speed thereof from the third rotational speed or the rotational halt to a fourth rotational speed higher than the third rotational speed during a period from the third time point to a fourth time point, and rotating the target substrate at the fourth rotational speed from the fourth time point to spin off residual parts of the resist solution.

2. The resist coating method according to claim 1, wherein the period from the first time point to the second time point is less than or equal to 0.2 seconds.

3. The resist coating method according to claim 1, wherein the period from the second time point to the third time point is less than or equal to 2.0 seconds.

4. The resist coating method according to claim 1, wherein the target substrate is a circular disk having a diameter of 200 mm, and the first rotational speed is 3,000 to 6,000 rpm.

5. The resist coating method according to claim 4, wherein the fourth rotational speed is 1,500 to 4,000 rpm.

6. The resist coating method according to claim 1, wherein the target substrate is a circular disk having a diameter of 300 mm, and the first rotational speed is 2,000 to 4,000 rpm.

7. The resist coating method according to claim 6, wherein the fourth rotational speed is 750 to 2,000 rpm.

8. The resist coating method according to claim 1, further comprising a step of supplying a solvent onto a surface of the target substrate to wet the surface thereof prior to coating of the resist solution.

9. The resist coating method according to claim 1, further comprising a step of controlling an acceleration rate in increasing the rotational speed to the fourth rotational speed from the third rotational speed to adjust a film thickness of the resist solution.

10. The resist coating method according to claim 1, wherein the first time point is the end of the supply period, at which supply of the resist solution is terminated.

11. The resist coating method according to claim 1, wherein the first deceleration rate is a constant deceleration rate.

12. A resist coating method comprising:
   supplying a resist solution to substantially a center of a circular target substrate to be processed while rotating the target substrate at a first rotational speed of 2,000 rpm to 6,000 rpm during a supply period, and terminating supply of the resist solution at an end of the supply period such that the resist solution is kept not supplied onto the target substrate thereafter until residual parts of the resist solution have been spun off;
   rotating the target substrate while reducing a rotational speed thereof from the first rotational speed to a second rotational speed that is lower than the first rotational speed and that is 500 to 2,000 rpm with a first deceleration rate of 20,000 to 50,000 rpm/sec during a period from a first time point after the supply period to a second time point;
   rotating the target substrate while reducing a rotational speed thereof from the second rotational speed to a third rotational speed that is lower than the second rotational speed and that is 100 to 500 rpm with a second deceleration rate of 1,000 to 5,000 rpm/sec during a period from the second time point to a third time point, the second deceleration rate gradually becoming smaller with a decrease in rotational speed of the target substrate;
   rotating the target substrate at the third rotational speed during a period from the third time point to a fourth time point, the periods from the first time point to the fourth time point being 1 to 3 seconds in total; and
   rotating the target substrate while accelerating a rotational speed thereof from the third rotational speed to a fourth rotational speed higher than the third rotational speed during a period from the fourth time point to a fifth time point, and rotating the target substrate at the fourth rotational speed from the fifth time point to spin off residual parts of the resist solution.

13. The resist coating method according to claim 12, wherein the period from the first time point to the second time point is less than or equal to 0.2 seconds.

14. The resist coating method according to claim 12, wherein the period from the second time point to the third time point is less than or equal to 2.0 seconds.

15. The resist coating method according to claim 12, wherein the target substrate is a circular disk having a diameter of 200 mm, and the first rotational speed is 3,000 to 6,000 rpm.

16. The resist coating method according to claim 15, wherein the fourth rotational speed is 1,500 to 4,000 rpm.

17. The resist coating method according to claim 12, wherein the target substrate is a circular disk having a diameter of 300 mm, and the first rotational speed is 2,000 to 4,000 rpm.

18. The resist coating method according to claim 17, wherein the fourth rotational speed is 750 to 2,000 rpm.

19. The resist coating method according to claim 12, further comprising a step of supplying a solvent onto a surface of the target substrate to wet the surface thereof prior to coating of the resist solution.

20. The resist coating method according to claim 12, further comprising a step of controlling an acceleration rate in increasing the rotational speed to the fourth rotational speed from the third rotational speed to adjust a film thickness of the resist solution.

21. The resist coating method according to claim 12, wherein the first time point is the end of the supply period, at which supply of the resist solution is terminated.

22. The resist coating method according to claim 12, wherein the first deceleration rate is a constant deceleration rate.

* * * * *